(12) United States Patent
Ono et al.

(10) Patent No.: US 11,136,474 B2
(45) Date of Patent: Oct. 5, 2021

(54) POLISHING LIQUID AND POLISHING METHOD

(71) Applicant: HITACHI CHEMICAL COMPANY, LTD., Tokyo (JP)

(72) Inventors: Hiroshi Ono, Tokyo (JP); Makoto Mizutani, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 0 days.

(21) Appl. No.: 16/484,157

(22) PCT Filed: Jan. 23, 2018

(86) PCT No.: PCT/JP2018/001981
§ 371 (c)(1),
(2) Date: Aug. 7, 2019

(87) PCT Pub. No.: WO2018/147074
PCT Pub. Date: Aug. 16, 2018

(65) Prior Publication Data
US 2019/0352537 A1 Nov. 21, 2019

(30) Foreign Application Priority Data
Feb. 8, 2017 (JP) .............................. JP2017-021359

(51) Int. Cl.
| C09G 1/02 | (2006.01) |
| H01L 21/768 | (2006.01) |
| C09G 1/00 | (2006.01) |
| C09K 3/14 | (2006.01) |
| C09G 1/06 | (2006.01) |

(Continued)

(52) U.S. Cl.
CPC .............. *C09G 1/02* (2013.01); *B24B 37/044* (2013.01); *C09G 1/00* (2013.01); *C09G 1/04* (2013.01); *C09G 1/06* (2013.01); *C09K 3/1454* (2013.01); *C09K 3/1463* (2013.01); *C09K 13/06* (2013.01); *H01L 21/30625* (2013.01); *H01L 21/3212* (2013.01); *H01L 21/7684* (2013.01)

(58) Field of Classification Search
None
See application file for complete search history.

(56) References Cited

U.S. PATENT DOCUMENTS

| 4,944,836 | A | 7/1990 | Beyer et al. |
| 2006/0010781 | A1* | 1/2006 | Ikeda ....................... C09G 1/02 51/309 |

(Continued)

FOREIGN PATENT DOCUMENTS

| JP | 2000-315667 A | 11/2000 |
| JP | 3822339 A | 9/2006 |

(Continued)

*Primary Examiner* — Jiong-Ping Lu
(74) *Attorney, Agent, or Firm* — Fitch, Even, Tabin & Flannery LLP

(57) ABSTRACT

A polishing liquid for polishing a surface to be polished containing a tungsten material, the polishing liquid comprising abrasive grains; a polymer having a cationic group at the terminal; an oxidizing agent; a metal oxide-dissolving agent; and water, in which the polymer has a structural unit derived from an unsaturated carboxylic acid, a weight average molecular weight of the polymer is 20000 or less, and a pH is less than 5.0.

11 Claims, 1 Drawing Sheet

(51) Int. Cl.
*B24B 37/04* (2012.01)
*C09G 1/04* (2006.01)
*C09K 13/06* (2006.01)
*H01L 21/321* (2006.01)
*H01L 21/306* (2006.01)

(56) References Cited

U.S. PATENT DOCUMENTS

| | | | | |
|---|---|---|---|---|
| 2007/0218811 A1* | 9/2007 | Kurata | ............... | C09G 1/02 451/28 |
| 2007/0298336 A1* | 12/2007 | Bayley | ............ | G03G 9/1139 430/31 |
| 2010/0120250 A1* | 5/2010 | Amanokura | ...... | C09K 3/1409 438/693 |
| 2011/0240594 A1 | 10/2011 | Hamaguchi et al. | | |
| 2015/0031205 A1 | 1/2015 | Mishima et al. | | |

FOREIGN PATENT DOCUMENTS

| | | |
|---|---|---|
| JP | 2010-518601 A | 5/2010 |
| JP | 2010-258416 A | 11/2010 |
| WO | 2015/108113 A1 | 7/2015 |

\* cited by examiner (a)
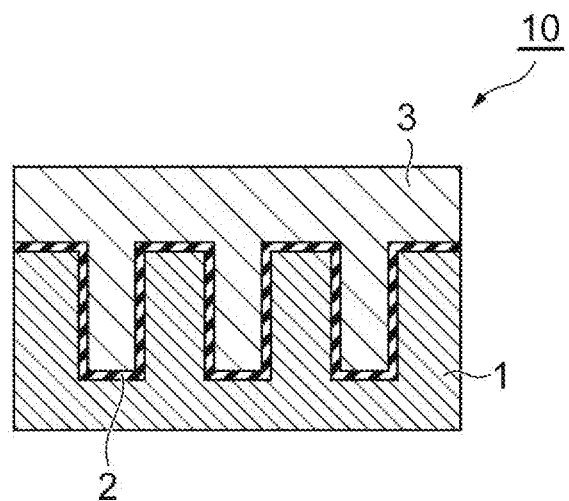
(b)
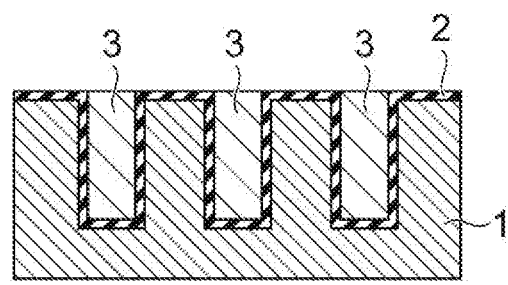
(c)
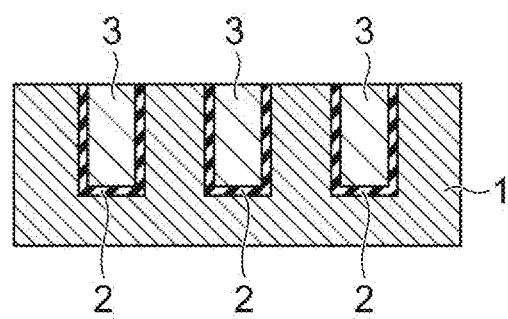

POLISHING LIQUID AND POLISHING METHOD

CROSS-REFERENCE TO RELATED APPLICATIONS

This application is a U.S. national phase application filed under 35 U.S.C. § 371 of International Application No. PCT/JP2018/001981, filed Jan. 23, 2018, designating the United States, which claims priority from Japanese Patent Application No. 2017-021359, filed Feb. 8, 2017, which are hereby incorporated herein by reference in their entirety.

TECHNICAL FIELD

The present invention relates to a polishing liquid and a polishing method. The present invention relates to a polishing liquid and a polishing method which are used, for example, in polishing in a wiring-forming step of a semiconductor device, and the like.

BACKGROUND ART

Along with an increase in density or improvement in performance of semiconductor integrated circuits (hereinafter, described as "LSI"), new microfabrication techniques are recently under development. A chemical mechanical polishing (hereinafter, described as "CMP") method is one of such methods, and is a technique used widely in the LSI production process (particularly, flattening interlayer dielectrics, forming metal plugs, forming embedded wiring, and the like in a multilayered wiring-forming step). This technique is disclosed, for example, in Patent Literature 1 described later.

As formation of embedded wiring using CMP, a damascene method is known. In the damascene method, for example, first, grooves are formed in advance on a surface of an insulating material such as silicon oxide, a barrier material (for example, a barrier film) having a shape following the surface of the insulating material is formed, and further, a wiring metal is deposited on the entire barrier material to embed the grooves. Then, the unnecessary wiring metal other than the wiring metal embedded in the grooves is removed, and then a part of the barrier material on the lower layer of the wiring metal is removed by CMP to form embedded wiring.

In recent years, in LSI, a tungsten material is used as a wiring metal or a barrier material, and a polishing liquid for removing the tungsten material is necessary. For example, Patent Literature 2 described below discloses a technique of polishing a tungsten material using a polishing liquid containing abrasive grains, hydrogen peroxide, an iron compound, and the like.

FIG. 1 illustrates an example of a method of forming wiring of a tungsten material by polishing (damascene process). An object to be polished (substrate) 10 includes, as illustrated in FIG. 1(a), an insulating material (such as silicon oxide) 1 having grooves on a surface thereof, a barrier material (such as titanium nitride) 2 having a shape following the surface of the insulating material, and a tungsten material (wiring metal) 3 covering the entire barrier material 2 to embed the grooves. A polishing method of the object to be polished 10 includes a rough polishing step of polishing the tungsten material 3 at a high polishing rate until the barrier material 2 is exposed (FIGS. 1(a) to 1(b)), as a step of eliminating unevenness generated in the rough polishing step (FIGS. 1(b) to 1(c)), an intermediate polishing step of polishing the barrier material 2 and the tungsten material 3 until the insulating material 1 is exposed and a final polishing step of polishing the insulating material 1, the barrier material 2, and the tungsten material 3 at a sufficient polishing rate to smoothly finish the surface to be polished, in this order.

Incidentally, in a case where suppressing of the etching of the tungsten material is insufficient when the tungsten material is polished using the polishing liquid, there is a problem in that keyholes are generated to decrease flatness. The keyholes are recesses mainly caused by etching and are easily generated at a via center portion having a relatively low corrosion resistance. Regarding the problem of the keyholes, it is considered that suppressing of the etching of the tungsten material is effective. However, since benzotriazole (BTA) that is effective in polishing of copper or the like is rarely effective as a protection film-forming agent for the tungsten material, a polishing liquid containing a protection film-forming agent capable of effectively suppressing the etching of the tungsten material is required.

For example, Patent Literature 3 described below discloses that a cationic water-soluble polymer such as polyethylenimine is used as a protection film-forming agent for a tungsten material and adsorbs to a surface of the tungsten material to form a protection film.

CITATION LIST

Patent Literature

Patent Literature 1: U.S. Pat. No. 4,944,836
Patent Literature 2: Japanese Patent No. 3822339
Patent Literature 3: Japanese Unexamined Patent Publication No. 2010-258416

SUMMARY OF INVENTION

Technical Problem

In recent years, as the polishing rate of the tungsten material, other than the polishing rate of about hundreds of nm/min as presented in Patent Literature 3 described above, a polishing rate of dozens of nm/min is required in final polishing or the like in some cases, and suppressing of the etching of the tungsten material while maintaining a sufficient polishing rate of the tungsten material is required. However, in the conventional polishing of the tungsten material, it is difficult to suppress the etching of the tungsten material while maintaining a sufficient polishing rate of the tungsten material in this way.

An object of the present invention is to provide a polishing liquid and a polishing method capable of suppressing the etching of a tungsten material while maintaining a sufficient polishing rate of the tungsten material.

Solution to Problem

The present inventors have conceived that a protection film-forming agent having an adsorption capacity suitable for a tungsten material is used for suppressing the etching of the tungsten material while maintaining a sufficient polishing rate of the tungsten material, and have found that the above object can be achieved in the case of using a specific polymer.

A polishing liquid of the present invention is a polishing liquid for polishing a surface to be polished containing a tungsten material, in which the polishing liquid contains abrasive grains, a polymer having a cationic group at the terminal, an oxidizing agent, a metal oxide-dissolving agent, and water, the polymer has a structural unit derived from an unsaturated carboxylic acid, a weight average molecular weight of the polymer is 20000 or less, and a pH is less than 5.0.

According to the polishing liquid of the present invention, it is possible to suppress the etching of the tungsten material while maintaining a sufficient polishing rate of the tungsten material. The polishing liquid of the present invention can be suitably used in an intermediate polishing step, a final polishing step, and the like in polishing of the tungsten material.

Incidentally, there is a case where an insulating material is polished along with the tungsten material (for example, the final polishing step), and the present inventors have found that the polymer in the present invention acts as a protection film-forming agent having an adsorption capacity suitable for the insulating material in addition to the tungsten material so that the tungsten material and the insulating material can be polished at a sufficient polishing rate while decreasing the etching rate of the tungsten material. According to the polishing liquid of the present invention, it is possible to suppress the etching of the tungsten material while maintaining sufficient polishing rates of the tungsten material and the insulating material.

The polymer preferably contains at least one selected from the group consisting of polyacrylic acid, polymethacrylic acid, and a copolymer of acrylic acid and methacrylic acid.

The polymer preferably has, as the cationic group, a cationic group derived from at least one polymerization initiator selected from the group consisting of 2,2'-azobis[2-(2-imidazolin-2-yl)propane]dihydrochloride, 2,2'-azobis[2-(2-imidazolin-2-yl)propane]disulfate dihydrate, 2,2'-azobis(2-methylpropionamidine)dihydrochloride, and 2,2'-azobis[2-(5-methyl-2-imidazolin-2-yl)propane]dihydrochloride.

The oxidizing agent preferably contains hydrogen peroxide.

The abrasive grains preferably contain at least one selected from the group consisting of silica, alumina, ceria, titania, zirconia, germania, and modified products thereof.

The metal oxide-dissolving agent preferably contains an organic acid. The organic acid preferably includes at least one selected from the group consisting of formic acid, malonic acid, malic acid, tartaric acid, citric acid, salicylic acid, and adipic acid.

A polishing method of the present invention polishes a surface to be polished containing a tungsten material using the polishing liquid of the present invention.

Advantageous Effects of Invention

According to the present invention, it is possible to provide a polishing liquid and a polishing method capable of suppressing the etching of the tungsten material while maintaining a sufficient polishing rate of the tungsten material. According to the present invention, it is possible to provide use of the polishing liquid to polishing of a surface to be polished containing a tungsten material. According to the present invention, it is possible to provide use of the polishing liquid to polishing of a surface to be polished containing a tungsten material and at least one selected from the group consisting of a barrier material and an insulating material.

BRIEF DESCRIPTION OF DRAWINGS

FIG. 1 is a schematic cross-sectional view for describing a method of forming wiring of a tungsten material by polishing.

DESCRIPTION OF EMBODIMENTS

Hereinafter, embodiments of the present invention will be described.

In the present specification, a numerical range that has been indicated with the use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical value range may be replaced with the value shown in the examples.

"A or B" may contain any one of A and B, and may contain both A and B. Materials listed as examples in the present specification can be used singly or in combinations of two or more, unless otherwise specifically indicated. In the present specification, when a plurality of substances corresponding to each component exist in the composition, the content of each component in the composition means the total amount of the plurality of substances that exist in the composition, unless otherwise specified.

The term "layer" includes a structure having a shape which is formed on a part, in addition to a structure having a shape which is formed on the whole surface, when the layer has been observed as a plan view. The term "step" includes not only an independent step but also a step by which an intended action of the step is achieved, though the step cannot be clearly distinguished from other steps.

<Polishing Liquid>

A polishing liquid of the present embodiment is a polishing liquid for polishing a surface to be polished containing a tungsten material, the polishing liquid is characterized in that it contains abrasive grains, a polymer (polycarboxylic acid-based polymer) having a cationic group at the terminal (cationic terminal group), an oxidizing agent, a metal oxide-dissolving agent, and water, the polymer has a structural unit derived from an unsaturated carboxylic acid, a weight average molecular weight of the polymer is 20000 or less, and a pH is less than 5.0. The polishing liquid of the present embodiment is, for example, a polishing liquid for a metal film containing a tungsten material. Hereinafter, the components contained in the polishing liquid, liquid properties, and the like will be described in detail.

(Abrasive Grains)

The polishing liquid of the present embodiment contains abrasive grains from the viewpoint of obtaining sufficient polishing rate of a tungsten material and an insulating material. The abrasive grains preferably contain at least one selected from the group consisting of silica, alumina, ceria, titania, zirconia, germania, and modified products thereof, from the viewpoint of easily obtaining sufficient polishing rate of a tungsten material and an insulating material. As abrasive grains containing silica, colloidal silica may be used. As abrasive grains containing alumina, colloidal alumina may be used.

Examples of the modified products include products obtained by modifying surfaces of particles containing silica, alumina, ceria, titania, zirconia, germania, and the like with an alkyl group. A method of modifying surfaces of particles with an alkyl group is not particularly limited, and examples thereof include a method of reacting a hydroxyl group existing on surfaces of particles with alkoxysilane having an alkyl group. The alkoxysilane having an alkyl group is not particularly limited, and examples thereof include monomethyltrimethoxysilane, dimethyldimethoxysilane, trimethylmonomethoxysilane, monoethyltrimethoxysilane, diethyldimethoxysilane, triethylmonomethoxysilane, monomethyltriethoxysilane, dimethyldiethoxysilane, and trimethylmonoethoxysilane. The reaction method is not particularly limited, and for example, reaction may be performed in a polishing liquid containing particles and alkoxysilane (polishing liquid at room temperature, or the like) or heating may be performed to accelerate the reaction.

The average particle diameter of the abrasive grains is preferably 10 nm or more, more preferably 20 nm or more, and further preferably 50 nm or more. The average particle diameter of the abrasive grains is preferably 200 nm or less, more preferably 100 nm or less, and further preferably 80 nm or less. From these viewpoints, the average particle diameter of the abrasive grains is preferably 10 to 200 nm, more preferably 20 to 100 nm, and further preferably 50 to 80 nm. Herein, the "average particle diameter" means a secondary particle diameter of the abrasive grains. The particle diameter (secondary particle diameter) can be measured, for example, by a light-diffraction-scattering particle size distribution analyzer.

Specifically, for example, measurement can be performed using COULTER N4SD (trade name) manufactured by COULTER Electronics, Inc. with measurement temperature: 20° C., solvent refractive index: 1.333 (water), particle refractive index: Unknown (setting), solvent viscosity: 1.005 cp (water), Run Time: 200 sec, laser incident angle: 90°, and Intensity (corresponding to scattering intensity and turbidity): range of 5E+04 to 4E+05, and in a case where Intensity is higher than 4E+05, the measurement can be performed after dilution with water.

Among the abrasive grains, from the viewpoint that dispersion stability in the polishing liquid is favorable and the number of scratches generated by CMP (polishing scratch) is small, at least one selected from the group consisting of colloidal silica having an average particle diameter of 200 nm or less and colloidal alumina having an average particle diameter of 200 nm or less is preferable, and at least one selected from the group consisting of colloidal silica having an average particle diameter of 100 nm or less and colloidal alumina having an average particle diameter of 100 nm or less is more preferable.

The content of the abrasive grain is preferably 0.01 mass % or more, more preferably 0.02 mass % or more, further preferably 0.05 mass % or more, particularly preferably 0.1 mass % or more, extremely preferably 0.5 mass % or more, and very preferably 1 mass % or more, based on the total mass of the polishing liquid, from the viewpoint of easily obtaining sufficient polishing rates of the tungsten material and the insulating material. The content of the abrasive grain is preferably 50 mass % or less, more preferably 30 mass % or less, further preferably 20 mass % or less, particularly preferably 10 mass % or less, and extremely preferably 5 mass % or less, based on the total mass of the polishing liquid, from the viewpoint of easily suppressing generation of scratches. From these viewpoints, the content of the abrasive grain is preferably 0.01 to 50 mass %, more preferably 0.02 to 30 mass %, further preferably 0.05 to 20 mass %, particularly preferably 0.1 to 20 mass %, extremely preferably 0.5 to 10 mass %, and very preferably 1 to 5 mass %, based on the total mass of the polishing liquid.

(Polycarboxylic Acid-Based Polymer)

The polycarboxylic acid-based polymer is not particularly limited as long as it is a polymer having a structural unit derived from an unsaturated carboxylic acid, having a weight average molecular weight of 20000 or less, and having a cationic group at the terminal, and is, for example, water-soluble. The polycarboxylic acid-based polymer suppresses the etching of the tungsten material. The cationic group at the terminal is a cationic group positioned at the terminal of the main chain. Examples of the cationic group include an amino group and a quaternary ammonium group (quaternary ammonium salt group).

The reason why the polycarboxylic acid-based polymer suppresses the etching of the tungsten material is not clear, but is considered that a cationic terminal group having a positive charge adsorbs to a tungsten material showing a negative zeta potential in a wide pH range to form a protection film. That is, the polycarboxylic acid-based polymer exhibits favorable properties as a protection film-forming agent of the tungsten material.

In a case where the terminal is not a cationic group but is a non-ionic group or an amphoteric group, such a sufficient effect of suppressing the etching is not obtainable.

Further, the polycarboxylic acid-based polymer is an anionic polymer having a structural unit derived from an unsaturated carboxylic acid. In the case of using a cationic polymer not having a structural unit derived from an unsaturated carboxylic acid (such as polyallylamine) singly instead of the anionic polymer, it is considered that the cationic polymer may exhibit the effect of suppressing the etching with respect to the tungsten material, but very strongly adsorbs to the tungsten material and the insulating material (such as silicon oxide), so that the polishing rates of the tungsten material and the insulating material are excessively decreased. Such an excess decrease in the polishing rates of the tungsten material and the insulating material is not observed in the polycarboxylic acid-based polymer.

Also, in the case of using a non-ionic polymer not having a structural unit derived from an unsaturated carboxylic acid instead of the anionic polymer, it is considered that the effect of suppressing the etching of the tungsten material may be exhibited if the terminal of the polymer is a cationic group, but similarly to the cationic polymer, a decrease in the polishing rate of the insulating material tends to be large, and aggregation and sedimentation of abrasive grains such as colloidal silica tend to be easily caused.

The polycarboxylic acid-based polymer may be a homopolymer of an unsaturated carboxylic acid, it may be a copolymer of one unsaturated carboxylic acid and other unsaturated carboxylic acid, or it may be a copolymer of an unsaturated carboxylic acid and other monomer.

A monomer (unsaturated carboxylic acid) used in synthesis of the polycarboxylic acid-based polymer is not particularly limited as long as it is polymerizable, and examples thereof include unsaturated carboxylic acids such as acrylic acid, methacrylic acid, crotonic acid, vinyl acetate, tiglic acid, 2-trifluoromethylacrylic acid, itaconic acid, fumaric acid, maleic acid, citraconic acid, and mesaconic acid. Among these, from the viewpoint of ease of purchase and synthesis, at least one selected from the group consisting of acrylic acid and methacrylic acid is preferable. As the unsaturated carboxylic acid, an unsaturated carboxylic acid not having a cationic group can be used.

Examples of other monomer co-polymerizable with the unsaturated carboxylic acid include acrylic acid-based esters or methacrylic acid-based esters such as methyl acrylate, ethyl acrylate, propyl acrylate, butyl acrylate, 2-ethylhexyl acrylate, methyl methacrylate, ethyl methacrylate, propyl methacrylate, butyl methacrylate, and 2-ethylhexyl methacrylate; and salts such as ammonium salts, alkali metal salts, and alkylamine salts thereof. In the case of a substrate to be applied being a silicon substrate for LSI or the like, since contamination due to an alkali metal is not desirable, a monomer not containing an alkali metal (such as the ammonium salt described above) is preferable. In the case of the substrate being a glass substrate or the like, the other monomer is not limited thereto.

From the viewpoint of easily suppressing the etching of the tungsten material while maintaining a sufficient polishing rate of the tungsten material, the polycarboxylic acid-based polymer preferably contains at least one selected from the group consisting of polyacrylic acid, polymethacrylic acid, and a copolymer of acrylic acid and methacrylic acid.

The terminal group of the polycarboxylic acid-based polymer is adjustable depending on the type of polymerization initiator, and selection of a suitable polymerization initiator can make the terminal to be a cationic group. As the polymerization initiator in polymer synthesis used for forming the terminal group of the polycarboxylic acid-based polymer, from the viewpoint of easily suppressing the etching of the tungsten material while maintaining a sufficient polishing rate of the tungsten material, at least one selected from the group consisting of 2,2'-azobis[2-(2-imidazolin-2-yl)propane]dihydrochloride, 2,2'-azobis[2-(2-imidazolin-2-yl)propane]disulfate dihydrate, 2,2'-azobis(2-methylpropionamidine)dihydrochloride, and 2,2'-azobis[2-(5-methyl-2-imidazolin-2-yl)propane]dihydrochloride is preferable. The polycarboxylic acid-based polymer preferably has a cationic group derived from the polymerization initiator described above.

The upper limit of the weight average molecular weight of the polycarboxylic acid-based polymer is 20000 or less. When the weight average molecular weight is more than 20000, an ability to suppress the etching of the tungsten material tends to decrease. The phenomenon that the ability to suppress the etching of the tungsten material decreases in the case of an excessively large molecular weight can be described as follows. It is considered that, since the polycarboxylic acid-based polymer adsorbs to a surface of the tungsten material by the cationic terminal group to protect the surface, when the molecular weight is large, the mass supporting an adsorption state by one terminal group is excessively large, so that the adsorption state is not held. Further, it is also considered that, when the molecular weight is large, the number of terminals is smaller than that in a case where the same mass as a polymer having a small molecular weight is added, so that an area to be protected may be small even when a polymer having a large molecular weight adsorbs.

The upper limit of the weight average molecular weight of the polycarboxylic acid-based polymer is preferably 15000 or less from the viewpoint of ease of suppressing the etching of the tungsten material, ease of synthesis, ease of controlling a molecular weight, and the like, and is more preferably 15000 or less, further preferably 10000 or less, particularly preferably 9000 or less, extremely preferably 8000 or less, very preferably 7500 or less, and even more preferably 7000 or less, from the viewpoint of further shortening the synthesis time.

The lower limit of the weight average molecular weight of the polycarboxylic acid-based polymer is preferably 500 or more, more preferably 1000 or more, further preferably 2000 or more, and particularly preferably 3000 or more. When the weight average molecular weight of the polycarboxylic acid-based polymer is 500 or more, the molecular weight control at the time of synthesis becomes easy. From these viewpoints, the weight average molecular weight of the polycarboxylic acid-based polymer is preferably 500 to 20000.

The weight average molecular weight of the polycarboxylic acid-based polymer can be measured by gel permeation chromatography using a calibration curve of standard polystyrene. As the measurement conditions, for example, the following conditions can be mentioned.

Device used: HPLC pump (manufactured by Hitachi, Ltd., L-7100) equipped with a differential refractometer (manufactured by Hitachi, Ltd., Model No. L-3300)

Column: Shodex Asahipak GF-710HQ (manufactured by Showa Denko K.K., trade name)

Mobile phase: Mixed liquid of 50 mM disodium hydrogen phosphate aqueous solution/acetonitrile=90/10 (V/V)

Flow rate: 0.6 mL/min

Column temperature: 25° C.

The content of the polycarboxylic acid-based polymer is preferably 0.001 mass % or more, more preferably 0.01 mass % or more, further preferably 0.03 mass % or more, particularly preferably 0.05 mass % or more, and extremely preferably 0.1 mass % or more, based on the total mass of the polishing liquid, from the viewpoint of easily and effectively suppressing the etching of the tungsten material and the viewpoint of easily controlling the content. The content of the polycarboxylic acid-based polymer is preferably 20 mass % or less, more preferably 15 mass % or less, further preferably 10 mass % or less, particularly preferably 5 mass % or less, extremely preferably 1 mass % or less, and very preferably 0.5 mass % or less, based on the total mass of the polishing liquid, from the viewpoint of easily suppressing occurrence of aggregation of the abrasive grains in the polishing liquid. From these viewpoints, the content of the polycarboxylic acid-based polymer is preferably 0.001 to 20 mass %, more preferably 0.001 to 15 mass %, further preferably 0.001 to 10 mass %, particularly preferably 0.01 to 10 mass %, extremely preferably 0.01 to 5 mass %, very preferably 0.03 to 5 mass %, even more preferably 0.05 to 1 mass %, and still more preferably 0.1 to 0.5 mass %, based on the total mass of the polishing liquid.

(Oxidizing Agent)

The polishing liquid of the present embodiment contains an oxidizing agent (metal oxidizing agent). Examples of the oxidizing agent include hydrogen peroxide, nitric acid, potassium periodate, hypochlorous acid, ozone water, a compound supplying iron ions (such as iron nitrate), a compound supplying copper ions, and a compound supplying silver ions, among these, hydrogen peroxide is preferable. The oxidizing agent may be used singly or in combination of two or more kinds thereof. In a case where the substrate is a silicon substrate including an element for an integrated circuit, contamination with an alkali metal, an alkaline earth metal, a halide, or the like is not desirable, and thus, an oxidizing agent not containing a non-volatile component is preferable. Since a change of the composition over time is severe in ozone water, hydrogen peroxide is preferable.

The content of the oxidizing agent is preferably 0.01 mass % or more, more preferably 0.02 mass % or more, and further preferably 0.05 mass % or more, based on the total mass of the polishing liquid, from the viewpoint of easily obtaining a favorable polishing rate of the tungsten material. The content of the oxidizing agent is preferably 50 mass % or less, more preferably 30 mass % or less, and further preferably 15 mass % or less, based on the total mass of the polishing liquid, from the viewpoint of easily decreasing the roughening of the polished surface. From these viewpoints, the content of the oxidizing agent is preferably 0.01 to 50 mass %, more preferably 0.02 to 30 mass %, and further preferably 0.05 to 15 mass %, based on the total mass of the polishing liquid.

(Metal Oxide-Dissolving Agent)

The polishing liquid of the present embodiment contains a metal oxide-dissolving agent from the viewpoint of promoting the dissolving of the tungsten material oxidized by the oxidizing agent and improving the polishing rate of the tungsten material. The metal oxide-dissolving agent is not particularly limited as long as it can dissolve the oxidized tungsten material in water, and examples thereof includes organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and p-toluenesulfonic acid; organic acid esters of the organic acids described above; ammonium salts of the organic acids described above; inorganic acids such as hydrochloric acid, sulfuric acid, and nitric acid; and ammonium salts of the inorganic acids described above (such as ammonium persulfate, ammonium nitrate, ammonium chloride, and chromic acid). Among these, from the viewpoint of maintaining a practical polishing rate and easily and effectively suppressing the etching, organic acids are preferable, and at least one selected from the group consisting of formic acid, malonic acid, malic acid, tartaric acid, citric acid, salicylic acid, and adipic acid is more preferable. The metal oxide-dissolving agent may be used singly or in combination of two or more kinds thereof.

The content of the metal oxide-dissolving agent is preferably 0.001 mass % or more, more preferably 0.002 mass % or more, further preferably 0.005 mass % or more, particularly preferably 0.01 mass % or more, extremely preferably 0.05 mass % or more, very preferably 0.1 mass % or more, and even more preferably 0.2 mass % or more, based on the total mass of the polishing liquid, from the viewpoint of easily obtaining a favorable polishing rate of the tungsten material. The content of the metal oxide-dissolving agent is preferably 20 mass % or less, more preferably 10 mass % or less, further preferably 5 mass % or less, particularly preferably 3 mass % or less, and extremely preferably 1 mass % or less, based on the total mass of the polishing liquid, from the viewpoint of easily decreasing the roughening of the polished surface by suppressing the etching of the tungsten material. From these viewpoints, the content of the metal oxide-dissolving agent is preferably 0.001 to 20 mass %, more preferably 0.002 to 10 mass %, further preferably 0.005 to 5 mass %, particularly preferably 0.01 to 5 mass %, extremely preferably 0.05 to 3 mass %, very preferably 0.1 to 1 mass %, and even more preferably 0.2 to 1 mass %, based on the total mass of the polishing liquid.

(Metal Corrosion Preventive Agent)

The polishing liquid of the present embodiment can contain, as necessary, a metal corrosion preventive agent (a corrosion preventive agent for a metal). The metal corrosion preventive agent can be used for preventing a surface of a metal (for example, copper) other than the tungsten material when the tungsten material and this metal were polished at the same time. Examples of the metal corrosion preventive agent include 2-mercaptobenzothiazole; triazole-based corrosion preventive agents (compounds having a triazole skeleton) such as 1,2,3-triazole, 1,2,4-triazole, 3-amino-1H-1,2, 4-triazole, benzotriazole, 1-hydroxybenzotriazole, 1-hydroxypropylbenzotriazole, 2,3-dicarboxypropylbenzotriazole, 4-hydroxybenzotriazole, 4-carboxyl(-1H-)benzotriazole, 4-carboxyl(-1H-)benzotriazole methyl ester, 4-carboxyl(-1H-)benzotriazole butyl ester, 4-carboxyl(-1H-) benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, and bis[(1-benzotriazolyl)methyl]phosphonic acid; and pyrimidine-based corrosion preventive agents (compounds having a pyrimidine skeleton) such as pyrimidine, 1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trione, 1,4,5,6-tetrahydropyrimidine, 2,4,5,6-tetraaminopyrimidine sulfate, 2,4,5-trihydroxypyrimidine, 2,4,6-triaminopyrimidine, 2,4, 6-trichloropyrimidine, 2,4,6-trimethoxypyrimidine, 2,4,6-triphenylpyrimidine, 2,4-diamino-6-hydroxylpyrimidine, 2,4-diaminopyrimidine, 2-acetamidopyrimidine, 2-aminopyrimidine, 2-methyl-5,7-diphenyl-(1,2,4)triazolo(1,5-a)pyrimidine, 2-methylsulfanyl-5,7-diphenyl-(1,2,4)triazolo(1, 5-a)pyrimidine, 2-methylsulfanyl-5,7-diphenyl-4,7-dihydro-(1,2,4)triazolo(1,5-a)pyrimidine, and 4-aminopyrazolo[3,4-d]pyrimidine. In a case where the wiring metal contains copper, from the viewpoint of having excellent corrosion prevention action, triazole-based corrosion preventive agents are preferably used. The metal corrosion preventive agent may be used singly or in combination of two or more kinds thereof.

The content of the metal corrosion preventive agent is preferably 0.001 to 10 mass %, more preferably 0.005 to 5 mass %, and further preferably 0.01 to 2 mass %, based on the total mass of the polishing liquid. When the content of the metal corrosion preventive agent is 0.001 mass % or more, the etching of the wiring metal is suppressed and the roughening of the polished surface is easily decreased. When the content of the metal corrosion preventive agent is 10 mass % or less, the polishing rates of the wiring metal and the barrier material (for example, a barrier metal) tend to become favorable.

(Organic Solvent)

The polishing liquid of the present embodiment can contain, as necessary, an organic solvent from the viewpoint of easily obtaining a favorable polishing rate of the insulating material even in the case of using an organic material as the insulating material. The organic solvent is not particularly limited, but a solvent which can be arbitrarily mixed with water is preferable. Examples of the organic solvent include carbonate esters such as ethylene carbonate, propylene carbonate, dimethyl carbonate, diethyl carbonate, and methylethyl carbonate; lactones such as butyrolactone and propiolactone; glycols such as ethylene glycol, propylene glycol, diethylene glycol, dipropylene glycol, triethylene glycol, and tripropylene glycol; as derivatives of glycols, glycol monoethers such as ethylene glycol monomethyl ether, propylene glycol monomethyl ether, diethylene glycol monomethyl ether, dipropylene glycol monomethyl ether, triethylene glycol monomethyl ether, tripropylene glycol monomethyl ether, ethylene glycol monoethyl ether, propylene glycol monoethyl ether, diethylene glycol monoethyl ether, dipropylene glycol monoethyl ether, triethylene glycol monoethyl ether, tripropylene glycol monoethyl ether, ethylene glycol monopropyl ether, propylene glycol monopropyl ether, diethylene glycol monopropyl ether, dipropylene glycol monopropyl ether, triethylene glycol monopropyl ether, tripropylene glycol monopropyl ether, ethylene glycol monobutyl ether, propylene glycol monobutyl ether, diethylene glycol monobutyl ether, dipropylene glycol monobutyl ether, triethylene glycol monobutyl ether, and tripropylene glycol monobutyl ether; glycol diethers such as ethylene glycol dimethyl ether, propylene glycol dimethyl ether, diethylene glycol dimethyl ether, dipropylene glycol dimethyl ether, triethylene glycol dimethyl ether, tripropylene glycol dimethyl ether, ethylene glycol diethyl ether, propylene glycol diethyl ether, diethylene glycol diethyl ether, dipropylene glycol diethyl ether, triethylene glycol diethyl ether, tripropylene glycol diethyl ether, ethylene glycol dipropyl ether, propylene glycol dipropyl ether, diethylene glycol dipropyl ether, dipropylene glycol dipropyl ether, triethylene glycol dipropyl ether, tripropylene glycol dipropyl ether, ethylene glycol dibutyl ether, propylene glycol dibutyl ether, diethylene glycol dibutyl ether, dipropylene glycol dibutyl ether, triethylene glycol dibutyl ether, and tripropylene glycol dibutyl ether; ethers such as tetrahydrofuran, dioxane, dimethoxyethane, polyethylene oxide, ethylene glycol monomethyl ether acetate, diethylene glycol monoethyl ether acetate, and propylene glycol monomethyl ether acetate; alcohols such as methanol, ethanol, propanol, n-butanol, n-pentanol, n-hexanol, and isopropanol; ketones such as acetone and methyl ethyl ketone; and in addition, phenol, dimethylformamide, N-methylpyrrolidone, ethyl acetate, ethyl lactate, and sulfolane. As the organic solvent, at least one selected from the group consisting of glycol monoethers, alcohols, and carbonate esters is preferable.

The content of the organic solvent is preferably 0.1 to 95 mass %, more preferably 0.2 to 50 mass %, and further preferably 0.5 to 10 mass %, based on the total mass of the polishing liquid. When the content of the organic solvent is 0.1 mass % or more, the wettability of the polishing liquid to the substrate becomes favorable. When the content of the organic solvent is 95 mass % or less, volatilization of the solvent is decreased and safety of production processes are easily secured.

(Water)

The polishing liquid of the present embodiment contains water. The content of water in the polishing liquid may be the remainder of the polishing liquid excluding the contents of other contained components.

(pH of Polishing Liquid)

The pH of the polishing liquid of the present embodiment is less than 5.0. There is a close relation between the pH of the polishing liquid and the etching rate of the tungsten material, and when the pH is 5.0 or more, the etching rate of the tungsten material tends to increase. The pH of the polishing liquid is preferably 4.5 or less, more preferably 4.0 or less, further preferably 3.5 or less, and particularly preferably 3.0 or less from the viewpoint that the etching of the tungsten material can be further suppressed. The pH of the polishing liquid is preferably 1.0 or more, more preferably 1.5 or more, further preferably 2.0 or more, and particularly preferably 2.5 or more from the viewpoint of easily suppressing corrosion of the polishing device. From these viewpoints, the pH of the polishing liquid is preferably 1.0 or more and less than 5.0. The pH of the polishing liquid is defined as pH in a liquid temperature of 25° C. As a pH adjuster for adjusting the pH of the polishing liquid, an acid component (such as organic acid and inorganic acid), ammonia, or the like can be used.

The pH of the polishing liquid of the present embodiment can be measured by a pH meter (for example, trade name: Model (F-51) manufactured by HORIBA, Ltd.). For example, the pH meter is calibrated by three points using a pH standard solution (pH: 4.01) of phthalate, a pH standard solution (pH: 6.86) of a neutral phosphate, and a pH standard solution (pH: 9.18) of a borate as a calibration solution, an electrode of the pH meter is put in the polishing liquid, and a stable value is measured after 2 min or longer has elapsed. At this time, the liquid temperatures of the calibration solution and the polishing liquid are set to 25° C.

The polishing liquid of the present embodiment may be stored as a one-pack type polishing liquid containing at least abrasive grains, a polycarboxylic acid-based polymer, an oxidizing agent, and a metal oxide-dissolving agent, and may be stored as a stock solution for the polishing liquid having a decreased content of water and used after dilution with water at the time of polishing.

The polishing liquid of the present embodiment may be stored as a multi-pack (for example, two-pack) polishing liquid set in which constituents of the polishing liquid are divided into a slurry (first liquid) and an additive liquid (second liquid) such that the slurry and the additive liquid are mixed to form the polishing liquid. For example, the polishing liquid of the present embodiment can also be divided into two liquids of a slurry containing at least abrasive grains and an additive liquid containing at least a polycarboxylic acid-based polymer. According to this, it is easy to avoid a problem of stability of the abrasive grains occurring at the time of adding a large amount of the polycarboxylic acid-based polymer. The slurry contains, for example, at least the abrasive grains and water. The additive liquid contains, for example, at least of the polycarboxylic acid-based polymer, the oxidizing agent, the metal oxide-dissolving agent, and water. In the case of division into two liquids, the polycarboxylic acid-based polymer may be contained in the slurry. In this case, the content of the polycarboxylic acid-based polymer in the slurry can be set to a range that does not impair the dispersibility of the abrasive grains. In the polishing liquid set, the slurry and the additive liquid are mixed right before or at the time of polishing to prepare the polishing liquid. The multi-pack polishing liquid set may be stored as a stock solution for the slurry and a stock solution for the additive liquid which have a decreased content of water and used after dilution with water at the time of polishing.

<Polishing Method>

The polishing method of the present embodiment includes a polishing step of polishing a surface to be polished containing a tungsten material using the polishing liquid of the present embodiment. The polishing liquid may be a polishing liquid obtained by diluting the stock solution for the polishing liquid with water or a polishing liquid obtained by mixing the slurry and the additive liquid in the polishing liquid set. The surface to be polished may have a layer containing at least a tungsten material. Examples of the tungsten material include tungsten and a tungsten compound. Examples of the tungsten compound include tungsten alloys.

In the polishing step, for example, the surface to be polished can be polished by supplying the polishing liquid of the present embodiment between the surface to be polished of the substrate and the polishing cloth and relatively moving the substrate with respect to the polishing platen in such a state that the surface to be polished of the substrate is pressed against a polishing cloth of the polishing platen and a predetermined pressure is applied to the substrate from a surface, which is opposite to the surface to be polished, of the substrate (the rear face of the substrate). In the polishing step, a material to be polished containing a tungsten material can be polished. The material to be polished may be a film shape (film to be polished) and may be a film containing a tungsten material. Examples of the film formation method include known sputtering method and plating method.

The polishing step may be a step of polishing a surface to be polished containing a tungsten material and at least one selected from the group consisting of a barrier material (for example, a barrier metal) and an insulating material using the polishing liquid of the present embodiment. The polishing step may be a step of polishing a substrate having, for example, at least a layer containing a tungsten material and at least one selected from the group consisting of a barrier layer and an insulating layer.

Examples of the barrier material include tantalum, tantalum alloys, tantalum compounds (such as tantalum oxide and tantalum nitride), titanium, titanium alloys, and titanium compounds (such as titanium oxide and titanium nitride). The tungsten material may be used as the barrier material. Examples of the insulating material include silicon oxide and silicon nitride.

In the polishing step, an object to be polished (substrate) 10 illustrated in FIG. 1 can be polished. For example, the polishing step may include a first polishing step (rough polishing step) of polishing a tungsten material 3 until a barrier material 2 is exposed, a second polishing step (intermediate polishing step) of polishing the barrier material 2 and the tungsten material 3 until the insulating material 1 is exposed, and a third polishing step (final polishing step) of polishing the insulating material 1, the barrier material 2, and the tungsten material 3, in this order.

The etching rate of the tungsten material is preferably 5.0 nm/min or less, more preferably 4.0 nm/min or less, and further preferably 3.5 nm/min or less from the viewpoint of easily suppressing occurrence of a problem such as an increase in wiring resistance.

The polishing rate of the tungsten material is preferably 10 nm/min or more, more preferably 12 nm/min or more, and further preferably 15 nm/min or more from the viewpoint that the polishing time can be shortened. The polishing rate of the tungsten material is preferably 40 nm/min or less from the viewpoint of easily obtaining more favorable flatness. From these viewpoints, the polishing rate of the tungsten material is preferably 10 to 40 nm/min, more preferably 12 to 40 nm/min, and further preferably 15 to 40 nm/min.

The polishing rate of the insulating material (for example, silicon oxide) is preferably 20 nm/min or more, more preferably 25 nm/min or more, and further preferably 30 nm/min or more from the viewpoint that the polishing time can be shortened and viewpoint of improving flatness. The polishing rate of the insulating material is preferably 100 nm/min or less from the viewpoint of easily obtaining more favorable smoothness and flatness. From these viewpoints, the polishing rate of the insulating material is preferably 20 to 100 nm/min, more preferably 25 to 100 nm/min, and further preferably 30 to 100 nm/min.

The ratio of the polishing rate of the tungsten material to the polishing rate of the insulating material (for example, silicon oxide) (the polishing rate of the tungsten material/the polishing rate of the insulating material; hereinafter, also referred to as "polishing rate ratio") is preferably such a polishing rate ratio that can decrease unevenness such as "protrusion" in which the wiring portion protrudes more than the insulating material portion in the outer edge of the wiring portion, and conversely, "dishing" in which the wiring portion is recessed.

In the case of the polishing liquid for final polishing, since the polishing rate of the tungsten material in the rough polishing is equal to or more than the polishing rate of the insulating material in many cases, there is a tendency that the state where dishing occurs or the state of flat is achieved at the time of end of rough polishing (at the time of start of final polishing). For this reason, the polishing rate ratio of the tungsten material to the insulating material is preferably less than 1.5, more preferably 1.2 or less, and further preferably 1.0 or less from the viewpoint of having favorable flatness after final polishing.

The polishing rate ratio of the tungsten material to the insulating material is preferably 0.2 or more and more preferably 0.25 or more from the viewpoint of easily decreasing the protrusion. The polishing rate ratio is, for example, a polishing rate ratio when a blanket wafer (blanket substrate) having a tungsten material film formed on the substrate and a blanket wafer having an insulating material film formed on the substrate are polished. The polishing rate ratio can be evaluated, for example, by polishing each of the blanket wafer having a tungsten material film smoothly formed on the substrate and the blanket wafer having an insulating material film smoothly formed on the substrate with the same polishing cloth at the same number of revolutions and the same load.

As a polishing device, for example, in the case of polishing with a polishing cloth, a general polishing device, which includes a holder capable of holding a substrate to be polished, and a polishing platen to which a motor that can change the number of revolutions or the like is connected and to which the polishing cloth can be attached, can be used. The polishing cloth is not particularly limited, and general nonwoven cloth, foamed polyurethane, porous fluororesin, or the like can be used.

The polishing condition is not limited, but the rotational speed of the platen is preferably a low rotation of 200 rpm or less from the viewpoint of suppressing flying-off of the substrate. The pressure at which a substrate (such as a semiconductor substrate) having a surface to be polished against the polishing cloth is preferably 1 to 300 kPa, and in order to satisfy uniformity of the polishing rate in the surface to be polished and flatness of patterns, the pressure is more preferably 5 to 300 kPa. During polishing, the polishing liquid can be continuously supplied to the polishing cloth with a pump or the like. The supplied amount thereof is not limited, but it is preferable that the surface of the polishing cloth is always covered with the polishing liquid.

In order to carry out the polishing (CMP) while always keeping the surface state of the polishing cloth constant, it is preferable to perform a conditioning step of a polishing cloth before polishing. For example, the conditioning of the polishing cloth is performed with a liquid containing at least water while using a dresser to which diamond particles attach. Subsequently, it is preferable to further perform a substrate cleaning step after performing the polishing method of the present embodiment. It is preferable to adequately wash the substrate after polishing in running water, and then perform drying after removing droplets, which have attached onto the substrate, with the use of a spin dry or the like. Further, it is more preferable to perform drying after performing a known cleaning method (for example, a method of removing the deposits on the substrate by pressing a brush made from polyurethane against the substrate with a constant pressure while letting a commercially available cleaning liquid flow on the surface of the substrate and rotating the brush).

EXAMPLES

Hereinafter, the present invention will be described in more detail by way of Examples; however, the present invention is not limited to these Examples without departing from the technical ideas of the present invention.
<Production of Polishing Liquid for CMP>

Example 1

To 700 g of deionized water, 4 g of malic acid was dissolved, and then 1 g of polymethacrylic acid 1 having a cationic group at the terminal of the main chain (polymethacrylic acid synthesized by using 2,2'-azobis[2-(5-methyl-2-imidazolin-2-yl)propane]dihydrochloride as a polymerization initiator and methacrylic acid as a monomer and having a weight average molecular weight of 7000) was dissolved, thereby an aqueous solution was obtained. To this aqueous solution, 100 g of colloidal silica (water dispersion having a silicon dioxide content of 20 mass %, pH: 8.1, specific gravity: 1.1, viscosity: 3.5 mPa·s, secondary particle diameter at the time of mixing: 60 nm) was added, and then 100 g of 30 mass % hydrogen peroxide solution was added. Further, 25 mass % of ammonia water (pH adjuster) was added in an appropriate amount to adjust the pH of the polishing liquid to 2.5, and then the deionized water residue was added to produce the total amount 1000 g of polishing liquid 1. In the polishing liquid, the content of the abrasive grains was 2 mass %, the content of the polymethacrylic acid 1 was 0.1 mass %, the content of the hydrogen peroxide was 3 mass %, and the content of the malic acid was 0.4 mass %.

Example 2

A polishing liquid 2 was produced in the same manner as in Example 1, except that polymethacrylic acid 2 having a cationic group at the terminal of the main chain and a weight average molecular weight of 3200 was used.

Example 3

A polishing liquid 3 was produced in the same manner as in Example 1, except that polymethacrylic acid 3 having a cationic group at the terminal of the main chain and a weight average molecular weight of 4300 was used.

Example 4

A polishing liquid 4 was produced in the same manner as in Example 1, except that polymethacrylic acid 4 having a cationic group at the terminal of the main chain and a weight average molecular weight of 9100 was used.

Example 5

A polishing liquid 5 was produced in the same manner as in Example 1, except that polymethacrylic acid 5 having a cationic group at the terminal of the main chain and a weight average molecular weight of 18500 was used.

Example 6

A polishing liquid 6 was produced in the same manner as in Example 1, except that 10 mass % of sulfuric acid aqueous solution was used as a pH adjuster instead of 25 mass % of ammonia water to adjust the pH to 2.0.

Example 7

A polishing liquid 7 was produced in the same manner as in Example 1, except that 25 mass % of ammonia water was used as a pH adjuster to adjust the pH to 3.0.

Example 8

A polishing liquid 8 was produced in the same manner as in Example 1, except that 25 mass % of ammonia water was used as a pH adjuster to adjust the pH to 4.0.

Example 9

A polishing liquid 9 was produced in the same manner as in Example 1, except that 25 mass % of ammonia water was used as a pH adjuster to adjust the pH to 4.5.

Example 10

A polishing liquid 10 was produced in the same manner as in Example 1, except that 1 g of polyacrylic acid 1 having a cationic group at the terminal of the main chain (polyacrylic acid synthesized by using 2,2'-azobis[2-(5-methyl-2-imidazolin-2-yl)propane]dihydrochloride as a polymerization initiator and acrylic acid as a monomer and having a weight average molecular weight of 8500) was used instead of the polymethacrylic acid 1.

Example 11

A polishing liquid 11 was produced in the same manner as in Example 1, except that 1 g of polyacrylic acid 2 having a cationic group at the terminal of the main chain (polyacrylic acid synthesized by using 2,2'-azobis[2-methylpropionamidine]dihydrochloride as a polymerization initiator and acrylic acid as a monomer and having a weight average molecular weight of 5200) was used instead of the polymethacrylic acid 1.

Comparative Example 1

A polishing liquid X1 was produced in the same manner as in Example 1, except that the polymethacrylic acid 1 was not used.

Comparative Example 2

A polishing liquid X2 was produced in the same manner as in Example 1, except that polyacrylic acid 3 having a weight average molecular weight of 25000 was used.

Comparative Example 3

A polishing liquid X3 was produced in the same manner as in Example 1, except that polyacrylic acid 4 having a weight average molecular weight of 48500 was used.

Comparative Example 4

A polishing liquid X4 was produced in the same manner as in Example 1, except that polyacrylic acid 5 having a weight average molecular weight of 101000 was used.

Comparative Example 5

A polishing liquid X5 was produced in the same manner as in Example 1, except that 25 mass % of ammonia water was used as a pH adjuster to adjust the pH to 5.0.

Comparative Example 6

A polishing liquid X6 was produced in the same manner as in Example 1, except that 25 mass % of ammonia water was used as a pH adjuster to adjust the pH to 6.0.

Comparative Example 7

A polishing liquid X7 was produced in the same manner as in Example 1, except that 1 g of polysulfonic acid 1 (polysulfonic acid synthesized by using 2,2'-azobis[2-(5-methyl-2-imidazolin-2-yl)propane]dihydrochloride as a polymerization initiator and 2-acrylamide-2-methylpropanesulfonic acid as a monomer and having a weight average molecular weight of 8400) was used instead of the polymethacrylic acid 1.

Comparative Example 8

A polishing liquid X8 was produced in the same manner as in Example 1, except that 1 g of polyallylamine 1 (polyallylamine synthesized by using 2,2'-azobis[2-(5-methyl-2-imidazolin-2-yl)propane]dihydrochloride as a polymerization initiator and allylamine as a monomer and having a weight average molecular weight of 25000) was used instead of the polymethacrylic acid 1.

Comparative Example 9

A polishing liquid X9 was produced in the same manner as in Example 1, except that 1 g of polyacrylic acid 6 (polyacrylic acid synthesized by using azobisisobutyronitrile as a polymerization initiator and acrylic acid as a monomer and having a weight average molecular weight of 4300) was used instead of the polymethacrylic acid 1.

Comparative Example 10

A polishing liquid X10 was produced in the same manner as in Example 1, except that 1 g of polyacrylic acid 7 (polyacrylic acid synthesized by using 4,4'-azobis(4-cyanovaleric acid) as a polymerization initiator and acrylic acid as a monomer and having a weight average molecular weight of 16000) was used instead of the polymethacrylic acid 1.

<pH Measurement>

The pH of the polishing liquid was measured under the following conditions.

Measuring instrument: HORIBA, Ltd., trade name: Model (F-51)

Calibration solutions: a pH standard solution (pH: 4.01) of a phthalate, a pH standard solution (pH: 6.86) of a neutral phosphate, and a pH standard solution (pH: 9.18) of a borate Measurement temperature: 25° C.

Measurement procedure: calibrating was performed by three points using the calibration solutions, then an electrode was put in a measurement target to leave to stand at 25° C. for 2 min or longer, and the stable pH was obtained as a measurement value.

<Measurement of Particle Diameter of Abrasive Grains>

The average particle diameter (secondary particle diameter) of the abrasive grains in the polishing liquid was measured using COULTER N4SD (trade name) manufactured by COULTER Electronics, Inc. The results are presented in Table 1.

<Measurement of Tungsten Etching Rate>

(Test Piece for Evaluation)

A laminate in which a tungsten film having a film thickness of 600 nm is formed on a silicon substrate having a diameter of 20 cm by a CVD method was cut into 2 cm square to obtain a tungsten test piece.

(Etching Method)

First, 100 g of polishing liquid was maintained at 60° C. Then, the tungsten test piece was mounted on a stirring blade. The test piece was immersed in the polishing liquid for 5 min while stirring with the number of revolutions of a stirrer being set to 100 min'

(Calculation Method of Tungsten Etching Rate)

A difference between film thicknesses of the tungsten films before and after immersing was obtained by conversion of electric resistance values thereof. The etching rate was calculated from the film thickness difference and the immersing time. The results are presented in Table 2. A value equal to or less than 5.0 nm/min was regarded as a favorable value.

<Measurement of Polishing Rate>

(Test Piece for Evaluation)

A laminate in which a tungsten film having a film thickness of 600 nm is formed on a silicon substrate having a diameter of 20 cm by a CVD method was cut into 2 cm square to obtain a tungsten test piece. In addition, a laminate in which a silicon oxide film having a film thickness of 800 nm is formed on a silicon substrate having a diameter of 20 cm by a CVD method was cut into 2 cm square to obtain a silicon oxide test piece.

(Polishing Method)

The test piece was fixed to a holder attached with a substrate-holding adsorption pad of a polishing device (manufactured by Nano Factor Co., LTD, FACT-200). Further, the holder with a film to be polished disposed downward was placed on a platen attached with a foamed polyurethane polishing cloth, and then a weight was placed thereon such that a working load would be 300 g/cm$^2$ (290 kPa). The film to be polished was polished for 60 sec while adding the polishing liquid dropwise onto the platen at 10 mL/min and setting the number of revolutions of the platen to 80 min$^{-1}$ (rpm).

(Calculation Method of Tungsten Polishing Rate)

The film thicknesses of the tungsten films before and after polishing were measured using a sheet resistance meter (manufactured by NAPSON CORPORATION, RT-80/RG-80), and the polishing rate was calculated from the film thickness difference. The results are presented in Table 2. A value equal to or more than 10 nm/min was regarded as a favorable value.

(Calculation Method of Silicon Oxide Polishing Rate)

The film thicknesses of the silicon oxide films before and after polishing were measured using a film thickness meter RE-3000 (manufactured by SCREEN Holdings Co., Ltd.), and the polishing rate was calculated from the film thickness difference. The results are presented in Table 2. A value equal to or more than 20 nm/min was regarded as a favorable value.

TABLE 1

| | Polishing liquid No. | Polymer | | |
|---|---|---|---|---|
| | | Polymer No. | Monomer | Polymerization initiator |
| Example 1 | Polishing liquid 1 | Polymethacrylic acid 1 | Methacrylic acid | Initiator A |
| Example 2 | Polishing liquid 2 | Polymethacrylic acid 2 | Methacrylic acid | Initiator A |
| Example 3 | Polishing liquid 3 | Polymethacrylic acid 3 | Methacrylic acid | Initiator A |
| Example 4 | Polishing liquid 4 | Polymethacrylic acid 4 | Methacrylic acid | Initiator A |
| Example 5 | Polishing liquid 5 | Polymethacrylic acid 5 | Methacrylic acid | Initiator A |
| Example 6 | Polishing liquid 6 | Polymethacrylic acid 1 | Methacrylic acid | Initiator A |
| Example 7 | Polishing liquid 7 | Polymethacrylic acid 1 | Methacrylic acid | Initiator A |
| Example 8 | Polishing liquid 8 | Polymethacrylic acid 1 | Methacrylic acid | Initiator A |
| Example 9 | Polishing liquid 9 | Polymethacrylic acid 1 | Methacrylic acid | Initiator A |
| Example 10 | Polishing liquid 10 | Polyacrylic acid 1 | Acrylic acid | Initiator A |
| Example 11 | Polishing liquid 11 | Polyacrylic acid 2 | Acrylic acid | Initiator B |
| Comparative Example 1 | Polishing liquid X1 | None | — | — |
| Comparative Example 2 | Polishing liquid X2 | Polyacrylic acid 3 | Acrylic acid | Initiator A |
| Comparative Example 3 | Polishing liquid X3 | Polyacrylic acid 4 | Acrylic acid | Initiator A |
| Comparative Example 4 | Polishing liquid X4 | Polyacrylic acid 5 | Acrylic acid | Initiator A |
| Comparative Example 5 | Polishing liquid X5 | Polymethacrylic acid 1 | Methacrylic acid | Initiator A |
| Comparative Example 6 | Polishing liquid X6 | Polymethacrylic acid 1 | Methacrylic acid | Initiator A |
| Comparative Example 7 | Polishing liquid X7 | Polysulfonic acid 1 | 2-Acrylamide-2-methylpropanesulfonic acid | Initiator A |
| Comparative Example 8 | Polishing liquid X8 | Polyallylamine 1 | Allylamine | Initiator A |
| Comparative Example 9 | Polishing liquid X9 | Polyacrylic acid 6 | Acrylic acid | Initiator C |
| Comparative Example 10 | Polishing liquid X10 | Polyacrylic acid 7 | Acrylic acid | Initiator D |

| | Polymer | | | pH of polishing liquid | Particle diameter of abrasive grains in polishing liquid (nm) |
|---|---|---|---|---|---|
| | Charge of Polymerization initiator | Weight average molecular weight (×1000) | Content (mass %) | | |
| Example 1 | Cation | 7.0 | 0.1 | 2.5 | 62 |
| Example 2 | Cation | 3.2 | 0.1 | 2.5 | 62 |
| Example 3 | Cation | 4.3 | 0.1 | 2.5 | 62 |
| Example 4 | Cation | 9.1 | 0.1 | 2.5 | 62 |
| Example 5 | Cation | 18.5 | 0.1 | 2.5 | 63 |
| Example 6 | Cation | 7.0 | 0.1 | 2.0 | 62 |
| Example 7 | Cation | 7.0 | 0.1 | 3.0 | 63 |
| Example 8 | Cation | 7.0 | 0.1 | 4.0 | 64 |
| Example 9 | Cation | 7.0 | 0.1 | 4.5 | 63 |
| Example 10 | Cation | 8.5 | 0.1 | 2.5 | 62 |
| Example 11 | Cation | 5.2 | 0.1 | 2.5 | 62 |
| Comparative Example 1 | — | — | — | 2.5 | 62 |
| Comparative Example 2 | Cation | 25.0 | 0.1 | 2.5 | 62 |
| Comparative Example 3 | Cation | 48.5 | 0.1 | 2.5 | 62 |
| Comparative Example 4 | Cation | 101.0 | 0.1 | 2.5 | 62 |
| Comparative Example 5 | Cation | 7.0 | 0.1 | 5.0 | 62 |
| Comparative Example 6 | Cation | 7.0 | 0.1 | 6.0 | 62 |
| Comparative Example 7 | Cation | 8.4 | 0.1 | 2.5 | 62 |
| Comparative Example 8 | Cation | 25.0 | 0.1 | 2.5 | 62 |
| Comparative Example 9 | Non-ion | 4.3 | 0.1 | 2.5 | 62 |
| Comparative Example 10 | Anion | 16.0 | 0.1 | 2.5 | 62 |

TABLE 2

| | Etching rate of tungsten (nm/min) | Polishing rate of tungsten (nm/min) | Polishing rate of silicon oxide (nm/min) |
|---|---|---|---|
| Example 1 | 1.9 | 15 | 53 |
| Example 2 | 1.0 | 16 | 51 |
| Example 3 | 1.2 | 17 | 53 |
| Example 4 | 1.1 | 16 | 55 |
| Example 5 | 2.6 | 18 | 58 |
| Example 6 | 1.7 | 16 | 58 |
| Example 7 | 1.2 | 18 | 55 |
| Example 8 | 1.3 | 19 | 40 |
| Example 9 | 3.6 | 21 | 35 |
| Example 10 | 1.1 | 16 | 54 |
| Example 11 | 1.4 | 16 | 51 |
| Comparative Example 1 | 7.2 | 14 | 72 |
| Comparative Example 2 | 6.5 | 16 | 58 |
| Comparative Example 3 | 6.2 | 17 | 60 |
| Comparative Example 4 | 8.8 | 17 | 65 |
| Comparative Example 5 | 10.1 | 20 | 30 |
| Comparative Example 6 | 9.7 | 19 | 26 |
| Comparative Example 7 | 10.1 | 17 | 58 |
| Comparative Example 8 | 1.1 | 1 | 7 |
| Comparative Example 9 | 8.9 | 16 | 65 |
| Comparative Example 10 | 6.8 | 16 | 62 |

Initiator A: 2,2'-azobis[2-(5-methyl-2-imidazolin-2-yl)propane]dihydrochloride
Initiator B: 2,2'-azobis[2-methylpropionamidine]dihydrochloride
Initiator C: azobisisobutyronitrile
Initiator D: 4,4'-azobis(4-cyanovaleric acid)

From the results of Table 2, it can be found that in Examples 1 to 11, the etching of tungsten can be suppressed while maintaining sufficient polishing rates of tungsten and silicon oxide. On the other hand, it can be found that Comparative Examples 1 to 10 are inferior to Examples 1 to 11 in the tungsten etching rate or the tungsten polishing rate and Comparative Example 8 is also inferior to Examples 1 to 11 in the polishing rate of silicon oxide.

In Comparative Example 1 not using the polycarboxylic acid-based polymer, the polishing rates of tungsten and silicon oxide were favorable but the tungsten etching rate was 7.2 nm/min, which was not favorable. On the other hand, it is found that in Example 1 using the polymethacrylic acid 1, the tungsten etching rate is decreased and a favorable etching rate of 1.9 nm/min is obtainable. Further, there was not a large decrease in polishing rates of tungsten and silicon oxide in Example 1, which was favorable.

In Examples 2, 3, 4, and 5 in which the weight average molecular weight of the polymer is changed within a range of 3200 to 18500, the tungsten etching rate, the tungsten polishing rate, and the silicon oxide polishing rate were favorable. On the other hand, in Comparative Examples 2, 3, and 4 using a polymer having a weight average molecular weight of more than 20000, the tungsten etching rate was 6.2 to 8.8 nm/min, which was not favorable. The reason for this is considered that a large molecular weight leads to a decrease in contribution of the cationic terminal group, and it is found that a somewhat small molecular weight range is necessary.

In Examples 6, 7, 8, and 9 in which the pH of the polishing liquid is changed within a range of 2.0 to 4.5, the tungsten etching rate, the tungsten polishing rate, and the silicon oxide polishing rate were favorable. On the other hand, in Comparative Examples 5 and 6 having a pH of 5.0 or more, the tungsten etching rate was 9.7 to 10.1 nm/min, which was not favorable. The reason for this is considered that when the pH increases to a certain degree or more, the corrosion tendency of the tungsten material becomes strong.

In Example 10 in which the monomer at the time of polymer synthesis is changed from methacrylic acid to acrylic acid that is an unsaturated carboxylic acid similarly to methacrylic acid, the tungsten etching rate, the tungsten polishing rate, and the silicon oxide polishing rate were favorable. On the other hand, in Comparative Example 7 using polysulfonic acid obtained by using, as a monomer, 2-acrylamide-2-methylpropanesulfonic acid that is a sulfonic acid compound, the sufficient suppressing effect of the etching of the tungsten material was not obtainable. The reason for this is considered that since disassociation of proton of sulfonic acid easily proceeds as compared to carboxylic acid, a charge at the main chain of the polysulfonic acid becomes large at the negative charge side as compared to polyacrylic acid so that adsorbability to the tungsten material having a negative charge is too weak. Further, in Comparative Example 8 using polyallylamine that is a cationic polymer, although the tungsten etching rate was 1.1 nm/min, which was low, the tungsten polishing rate was 1 nm/min and the silicon oxide polishing rate was 7 nm/min so that the polishing rate significantly decreased as compared to Examples. The reason for this is considered that since the main chain of polyallylamine has a strong positive charge, polyallylamine excessively strongly adsorbed to the tungsten material and the silicon oxide.

In Example 11 using a cationic initiator different from that in Example 1 at the time of polymer synthesis, the tungsten etching rate, the tungsten polishing rate, and the silicon oxide polishing rate were favorable. On the other hand, in Comparative Example 9 using a non-ionic initiator and Comparative Example 10 using an anionic initiator, the tungsten etching rates were 8.9 nm/min and 6.8 nm/min, respectively, and the sufficient suppressing effect of etching was not obtainable. The reason for this is considered that the adsorption capacity with respect to the tungsten material having a negative charge decreases more than that of the polymer using a cationic initiator.

REFERENCE SIGNS LIST

1: insulating material, 2: barrier material, 3: tungsten material, 10: object to be polished.

The invention claimed is:

1. A polishing liquid for polishing a surface to be polished containing a tungsten material, the polishing liquid comprising:
abrasive grains; a polymer comprising structural units derived from one or more of acrylic acid and methacrylic acid, the polymer comprising a cationic group at a terminal; an oxidizing agent; a metal oxide-dissolving agent; and water, wherein
a weight average molecular weight of the polymer is 20000 or less, and
a pH is less than 5.0.

2. The polishing liquid according to claim 1, wherein the polymer contains at least one selected from the group consisting of polyacrylic acid, polymethacrylic acid, and a copolymer of acrylic acid and methacrylic acid.

3. The polishing liquid according to claim 1, wherein the oxidizing agent contains hydrogen peroxide.

4. The polishing liquid according to claim 1, wherein abrasive grains contain at least one selected from the group consisting of silica, alumina, ceria, titania, zirconia, germania, and modified products thereof.

5. The polishing liquid according to claim 1, wherein the metal oxide-dissolving agent contains an organic acid.

6. The polishing liquid according to claim 5, wherein the organic acid includes at least one selected from the group consisting of formic acid, malonic acid, malic acid, tartaric acid, citric acid, salicylic acid, and adipic acid.

7. The polishing liquid according to claim 1, wherein the polymer comprises, as the cationic group, a cationic group derived from 2,2'-azobis(2-methylpropionamidine)dihydrochloride.

8. The polishing liquid according to claim 1, wherein the polymer comprises, as the cationic group, a cationic group derived from 2,2'-azobis[2-(5-methyl-2-imidazolin-2-yl)propane]dihydrochloride.

9. The polishing liquid according to claim 1, wherein the cationic group is an amino group.

10. The polishing liquid according to claim 1, wherein the polymer is dissolved in the polishing liquid.

11. A polishing method of polishing a surface to be polished containing a tungsten material using the polishing liquid according to claim 1.

* * * * *